United States Patent
Shimomura et al.

(10) Patent No.: US 7,534,705 B2
(45) Date of Patent: May 19, 2009

(54) METHOD OF MANUFACTURING A SEMICONDUCTOR DEVICE

(75) Inventors: Akihisa Shimomura, Atsugi (JP); Osamu Nakamura, Atsugi (JP); Tatsuya Arao, Atsugi (JP); Hidekazu Miyairi, Atsugi (JP); Atsuo Isobe, Atsugi (JP); Tamae Takano, Atsugi (JP); Kouki Inoue, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/978,585

(22) Filed: Oct. 30, 2007

(65) Prior Publication Data
US 2008/0070352 A1 Mar. 20, 2008

Related U.S. Application Data

(62) Division of application No. 10/607,542, filed on Jun. 27, 2003, now Pat. No. 7,329,594.

(30) Foreign Application Priority Data
Jun. 28, 2002 (JP) ............................. 2002-191493

(51) Int. Cl.
*H01L 21/425* (2006.01)
(52) U.S. Cl. ........................ 438/517; 438/149; 438/479; 438/487; 257/E21.334
(58) Field of Classification Search ................... 438/149, 438/487, 517, 479; 257/E21.334
See application file for complete search history.

(56) References Cited

U.S. PATENT DOCUMENTS
4,168,990 A 9/1979 Lenie et al.
(Continued)

FOREIGN PATENT DOCUMENTS
JP 62-262431 11/1987
(Continued)

OTHER PUBLICATIONS
Suga et al., "P-3: The Effect of a Laser Annealing Ambient on the Morphology and TFT Performance of Poly-Si Films" SID Digest '00, SID International Symposium Digest of Technical Papers, Jan. 1, 2000, pp. 534-537.
(Continued)

*Primary Examiner*—Charles D. Garber
*Assistant Examiner*—Stanetta D Isaac
(74) *Attorney, Agent, or Firm*—Eric J. Robinson; Robinson Intellectual Property Law Office, P.C.

(57) ABSTRACT

An impurity of one conductivity type is ionized and accelerated by electric field before being implanted into a semiconductor layer to form a high concentration impurity region near its surface. Then the semiconductor layer is irradiated with continuous wave laser light for melting and crystallization or recrystallization, through which a region where the concentration of the impurity is constant is formed in the semiconductor layer. The continuous wave laser light irradiation may bring the semiconductor layer to the crystalline phase from the amorphous phase as long as the impurity element is redistributed. The impurity is segregated through this process to newly create a high concentration region. However, this region is removed and no problem arises.

18 Claims, 17 Drawing Sheets

U.S. PATENT DOCUMENTS

| | | | |
|---|---|---|---|
| 4,169,740 | A | 10/1979 | Kalbitzer et al. |
| 4,199,773 | A | 4/1980 | Goodman et al. |
| 4,463,492 | A | 8/1984 | Maeguchi |
| 4,775,641 | A | 10/1988 | Duffy et al. |
| 5,064,775 | A | 11/1991 | Chang |
| 5,244,820 | A | 9/1993 | Kamata et al. |
| 5,403,762 | A | 4/1995 | Takemura |
| 5,501,989 | A | 3/1996 | Takayama et al. |
| 5,532,175 | A | 7/1996 | Racanelli et al. |
| 5,565,690 | A | 10/1996 | Theodore et al. |
| 5,698,882 | A | 12/1997 | Park |
| 5,757,048 | A | 5/1998 | Inoue |
| 6,031,249 | A | 2/2000 | Yamazaki et al. |
| 6,165,876 | A | 12/2000 | Yamazaki et al. |
| 6,278,132 | B1 | 8/2001 | Yamazaki et al. |
| 6,376,336 | B1 | 4/2002 | Buynoski |
| 6,506,669 | B1 | 1/2003 | Kuramasu et al. |
| 6,534,353 | B1 | 3/2003 | Kuramasu et al. |
| 6,559,036 | B1 | 5/2003 | Ohtani et al. |
| 6,596,571 | B2 | 7/2003 | Arao et al. |
| 6,613,620 | B2 | 9/2003 | Fujimoto et al. |
| 6,624,473 | B1 | 9/2003 | Takehashi et al. |
| 6,682,964 | B2 | 1/2004 | Hwang et al. |
| 6,703,265 | B2 | 3/2004 | Asami et al. |
| 6,753,212 | B2 | 6/2004 | Yamazaki et al. |
| 6,759,678 | B2 | 7/2004 | Yamazaki et al. |
| 6,773,996 | B2 | 8/2004 | Suzawa et al. |
| 6,803,296 | B2 | 10/2004 | Miyairi |
| 6,812,071 | B2 | 11/2004 | Hayashi et al. |
| 6,825,488 | B2 | 11/2004 | Yamazaki et al. |
| 6,855,584 | B2 | 2/2005 | Yamazaki et al. |
| 6,893,987 | B2 * | 5/2005 | Shiota et al. ............ 438/401 |
| 6,911,698 | B2 | 6/2005 | Yamazaki et al. |
| 6,913,956 | B2 | 7/2005 | Hamada et al. |
| 6,964,890 | B1 | 11/2005 | Yamazaki |
| 6,974,731 | B2 | 12/2005 | Yamazaki et al. |
| 7,037,765 | B2 | 5/2006 | Yamazaki et al. |
| 7,052,943 | B2 | 5/2006 | Yamazaki et al. |
| 7,141,823 | B2 | 11/2006 | Hamada et al. |
| 7,151,015 | B2 | 12/2006 | Suzawa et al. |
| 7,186,600 | B2 | 3/2007 | Ohtani et al. |
| 7,218,361 | B2 | 5/2007 | Yamazaki et al. |
| 7,282,398 | B2 | 10/2007 | Yamazaki et al. |
| 2006/0145153 | A1 | 7/2006 | Yamazaki et al. |

FOREIGN PATENT DOCUMENTS

| | | |
|---|---|---|
| JP | 08-078329 | 3/1996 |
| JP | 08-204208 | 8/1996 |
| JP | 08-255916 | 10/1996 |
| JP | 10-079517 | 3/1998 |
| JP | 10-200120 | 7/1998 |
| JP | 11-298003 | 10/1999 |
| JP | 2000-349295 | 12/2000 |
| JP | 2000-357798 | 12/2000 |
| JP | 2001-060551 | 3/2001 |
| JP | 2001-093598 | 4/2001 |
| JP | 2001-144027 | 5/2001 |
| JP | 2001-250776 | 9/2001 |
| JP | 2002-083805 | 3/2002 |
| JP | 2002-124685 | 4/2002 |
| JP | 2002-324808 | 11/2002 |
| JP | 2003-051446 | 2/2003 |

OTHER PUBLICATIONS

Y. Mishima et al., "Implantation Temperature Effect on Polycrystalline Silicon by Ion Shower Doping," Journal of Applied Physics, vol. 74, Dec. 15, 1993, No. 12, pp. 7114-7117.

Laviron et al., "Excimer-Laser Activation of Dopants in Silicon: A New Concept for a Uniform Treatment Over a Whole Die Area," International Workshop on Junction Technology, 2001, pp. 6-1-1~6-1-4.

Sasaki et al., "12.3: High Throughput CW-Laser Lateral Crystallization for Low-Temperature Poly-Si TFTs and Fabrication of 16 bit SRAMs and 270MHz Shift Registers," SID 02 Digest, pp. 154-157.

* cited by examiner

METHOD OF MANUFACTURING A SEMICONDUCTOR DEVICE

BACKGROUND OF THE INVENTION

1. Field of the Invention

The present invention relates to a semiconductor device with a crystalline semiconductor layer formed on an insulating surface, and particularly to a semiconductor device in which an insulating gate field effect transistor is constructed with a crystalline semiconductor layer being crystallized by laser light irradiation.

2. Description of the Related Art

Technologies of manufacturing an insulating gate field effect transistor by forming an amorphous silicon film on a substrate with an insulating surface and crystallizing the film by laser light irradiation are applied to active matrix liquid crystal display devices, typically flat surface type display devices (flat panel displays).

An example of crystallizing an amorphous semiconductor layer by laser light irradiation is polycrystallization technology, in which a thin film transistor (TFT) is manufactured by irradiating the second harmonic of laser light, emitted using a solid state laser apparatus such as an Nd:YBO$_4$ laser, to an amorphous semiconductor layer, thus forming a crystalline semiconductor layer having a large grain size compared to conventional crystalline semiconductor films, as disclosed in JP 2001-144027 A.

Further, as related technology, in "N. Sasaki et al, 2002 SID International Symposium Digest of Technical Papers, pp. 154-157", lateral crystal growth by continuous wave laser is reported, and a shift resistor operating at 270 MHz by a TFT manufactured with the technology is disclosed therein.

According to the above document, laser annealing that uses a continuous wave laser oscillator is characterized in that a semiconductor layer is heated by laser light for a longer period of time than when the light source is a pulse laser oscillator, a typical example of which is an excimer laser. The method is also characterized in that crystals grow in a direction that makes the interface between a melt region and a solid phase region roughly parallel to the substrate surface.

It is a known fact that the crystal grain size is varied depending on the thickness of a semiconductor layer that is crystallized by laser annealing. The field effect mobility, which is one of characteristics of a TFT, can be raised by increasing the crystal grain size. FIG. 2 is a graph showing changes in field effect mobility in relation to the thickness of the semiconductor layer and shows a characteristic of an n-channel TFT. The graph compares the characteristic of the TFT of when it receives channel doping (doping with an impurity of one conductivity type the main purpose of which is to control the threshold voltage) (indicated by an outlined triangle) to the characteristic of when there is no channel doping (indicated by an outlined square). According to the graph, higher field effect mobility is obtained in a film thickness range between 70 nm and 150 nm when the TFT does not receive channel doping. On the other hand, the characteristic of when there is channel doping is low in film thickness dependency. The difference is due to the crystallinity being lowered by ions which are implanted into crystals through channel doping.

However, when the TFT does not receive channel doping, the off leak current tends to increase as the thickness of the semiconductor layer is increased, resulting in insufficient ON/OFF ratio. This means that channel doping has an effect of lowering off leak current in addition to the effect of controlling the threshold voltage. In other words, when channel doping is omitted, a rise in gate voltage does not bring enough widening of a depletion layer to leave a not-depleted region deep in the bottom of the semiconductor layer and the not-depleted region forms a so-called back channel which depends solely on the source-drain voltage to cause a current flow. The back channel is formed because of the fact that any amorphous semiconductor layer formed by deposition on a substrate that has an insulating surface exhibits the n type conductivity to a varying degree when crystallized.

This phenomenon has been examined through a simulation performed on the relation between the semiconductor layer thickness and the electric charge density, and the results of the simulation are shown in FIGS. 3 to 6. Calculation in the simulation is made setting the semiconductor layer thickness to 60 mm (FIG. 3), 80 mm (FIG. 4), 100 mm (FIG. 5), and 150 mm (FIG. 6). The subject elements are n-channel TFTs having a single gate structure.

Application of −10 V to the gate and +1 V to the drain is set as a calculation parameter. In this case, electrons which are major carriers in a semiconductor layer that exhibits weak n type conductivity are repelled and move away from the interface of the gate insulating film. Donor ions having positive electric charges remain in the depletion layer. Holes are accumulated at the interface of the gate insulating film to form an inversion layer. When the semiconductor layer has a thickness of 60 nm, most of the semiconductor layer is depleted as shown in FIG. 3. As the thickness of the semiconductor layer exceeds 60 nm, a deeper region away from the interface of the gate insulating film is no longer influenced by the gate voltage and a region where negative electric charges are accumulated is created. Comparison among FIGS. 4 to 6 shows that the accumulation region becomes thicker as the semiconductor layer increases its thickness from 80 nm to 150 nm.

The back channel causes a drain current to flow when the TFT is turned off (off leak current) since a region having the same conductivity type as the source and drain regions is formed to serve as a path through which a drain current flows independent of the gate voltage.

The depletion layer could be widened by electric neutralization through doping with an acceptor impurity which has the opposite conductivity type. However, this measure becomes difficult as the thickness of the semiconductor layer is increased. In particular, in a region located deep in the semiconductor layer, acceptor ions have to be implanted at high acceleration voltage, causing damage in crystals and lowering of the crystallinity. Furthermore, if the acceptor ions accidentally pierce the semiconductor layer and reach the underlying insulating layer, the acceptor ions act as fixed electric charges and cause a change in TFT threshold voltage. This traps carriers and brings a change in characteristic as well as various other inconveniences. In addition, ion implantation or ion shower doping in which ionized impurities are implanted while being accelerated by electric field, is incapable of uniformly distributing ions along the entire depth of the semiconductor layer.

SUMMARY OF THE INVENTION

The present invention has been made in view of the above, and an object of the present invention is to provide an insulated gate field effect transistor which has excellent crystallinity, high field effect mobility, and lowered off leak current as well as a semiconductor device using this transistor.

In order to attain the above object, according to the present invention, a crystalline semiconductor layer is formed by heating an amorphous semiconductor layer on a substrate that has an insulating surface; an impurity region that contains an impurity of one conductivity type is formed on the front side of the crystalline semiconductor layer by implantation while accelerating an ionized impurity of the one conductivity type at low acceleration voltage; the crystalline semiconductor layer is irradiated with laser light to melt and re-crystallize the crystalline semiconductor layer for re-distribution of the one conductivity type impurity in the impurity region; the high concentration impurity region where the one conductivity type impurity is segregated on the front side of the crystalline semiconductor layer is removed as a result of the laser irradiation, thereby leaving a portion of the crystalline semiconductor layer in which the concentration of the one conductivity type impurity is $1 \times 10^{15}$ to $5 \times 10^{18}/cm^3$, the concentration being ±10% of the average; and a channel portion of an insulated gate field effect transistor is formed from the remaining portion of the crystalline semiconductor layer.

In the above structure of the present invention, the amorphous semiconductor layer is crystallized by heat treatment, laser annealing, or a crystallization method using a metal element that has an action of accelerating crystallization of an amorphous semiconductor layer. In either case, the heating temperature has to be high enough to crystallize the amorphous semiconductor layer but lower than the distortion temperature of the substrate. If laser light is employed in crystallization instead of heat treatment, a high power excimer laser oscillator may be used for laser annealing.

An impurity of one conductivity type is implanted to turn the n conductivity type of a crystalline semiconductor layer to intrinsic, and usually is an acceptor. The implantation method employed may be ion implantation in which only prescribed amount of ions are implanted through mass separation or may be ion shower doping in which ionized impurities are showered for implantation with or without mass separation. These implantation methods allow the use of known impurity gas such as $B_2H_6$ or $BF_3$ for source gas which provides an acceptor. The acceleration voltage is set to an energy level that does not damage the crystallinity of the crystalline semiconductor layer much, preferably 30 kV or lower. At this level of acceleration voltage, ion species travel only 100 nm or so from the film surface and, in addition, the concentration is rapidly lowered in the depth direction because of Gaussian distribution. Therefore lowering of the crystallinity can be stopped at a shallow point near the film surface.

The amorphous semiconductor layer, or the crystalline semiconductor layer obtained by crystallizing the amorphous semiconductor layer, is doped with the impurity of the one conductivity type and either case yields the same result. If the dose of the impurity of the one conductivity type is large, it is preferred to dope the crystalline semiconductor layer for ease of subsequent crystallization, or to dope a portion of the semiconductor layer that is small enough to leave a crystal region after implantation of the one conductivity type impurity.

The laser oscillator used is a solid-state laser oscillator, preferably, a continuous wave laser oscillator which uses crystals of YAG, $YVO_4$, YLF, $YAlO_3$ or the like doped with Cr, Nd, Er, Ho, Ce, Co, Ti, or Tm. The fundamental wave of the laser oscillator is about 1 μm, although it varies depending on the material used for doping. Harmonic of the fundamental wave is obtained through a non-linear optical element. Second harmonic of the above laser oscillator has a wavelength which is substantially in the visible light range and third harmonic thereof has a wavelength in the ultraviolet range. Typically, a Nd:$YVO_4$ laser (fundamental wave: 1064 nm) is chosen and its second harmonic (532 nm) or third harmonic (355 nm) is employed.

The harmonic is shaped by an optical system into rectangular or elliptical laser light on an irradiation surface to irradiate a target. The energy density necessary to irradiate a target is 0.01 to 100 MW/$cm^2$ (preferably 0.1 to 10 MW/$cm^2$). The semiconductor layer is irradiated with the laser light while being moved at a rate of 0.5 to 200 cm/sec relative to the laser light. As a result, the semiconductor layer having a thickness of 60 nm or more experiences melting and solidification through which the semiconductor layer is crystallized or re-crystallized to re-distribute the one conductivity type impurity that has been implanted. The melting and solidification process creates, on the film surface, through segregation, a region which contains the one conductivity type impurity in high concentration. The high concentration region is roughly 10 to 50 nm deep and it is sufficient if the superficial layer of the semiconductor layer is ground down to that depth and removed through etching or chemical mechanical polishing. In this way, a semiconductor layer having a thickness of 60 nm or more can be doped with an impurity of one conductivity type with the concentration set to $1 \times 10^{15}$ to $5 \times 10^{18}/cm^3$ and the concentration distribution set within ±10% of the average while avoiding lowering of the crystallinity.

With the above structure of the present invention, an impurity of one conductivity type to dope a channel portion of a crystalline semiconductor layer can be distributed in a fixed concentration along the depth of the film throughout the entire crystalline semiconductor layer while avoiding lowering of the crystallinity. Accordingly, a field effect transistor having high field effect mobility can be manufactured.

The term amorphous semiconductor layer in the present invention refers not only to a semiconductor layer that has a complete amorphous structure in a strict sense but also to a so-called microcrystalline semiconductor layer which contains minute crystal grains and a semiconductor layer that locally contains a crystal structure. Typically, an amorphous silicon film is employed. An amorphous silicon germanium film, an amorphous silicon carbide film, or the like may be employed instead.

DETAILED DESCRIPTION OF THE PREFERRED EMBODIMENTS

In a typical mode of the present invention, an impurity of one conductivity type is ionized and accelerated by electric field before implanted into a semiconductor layer to form a high concentration impurity region near its surface, and the semiconductor layer is then irradiated with continuous wave laser light for melting and crystallization or recrystallization, through which a region where the concentration of the impurity is constant is formed in the semiconductor layer. The continuous wave laser light irradiation may bring the semiconductor layer to the crystalline phase from the amorphous phase as long as the impurity element is re-distributed. The impurity is segregated on the film surface through this process to newly create a high concentration region. However, this region is removed by chemical etching or chemical mechanical polishing and no problem arises.

Figure 1:
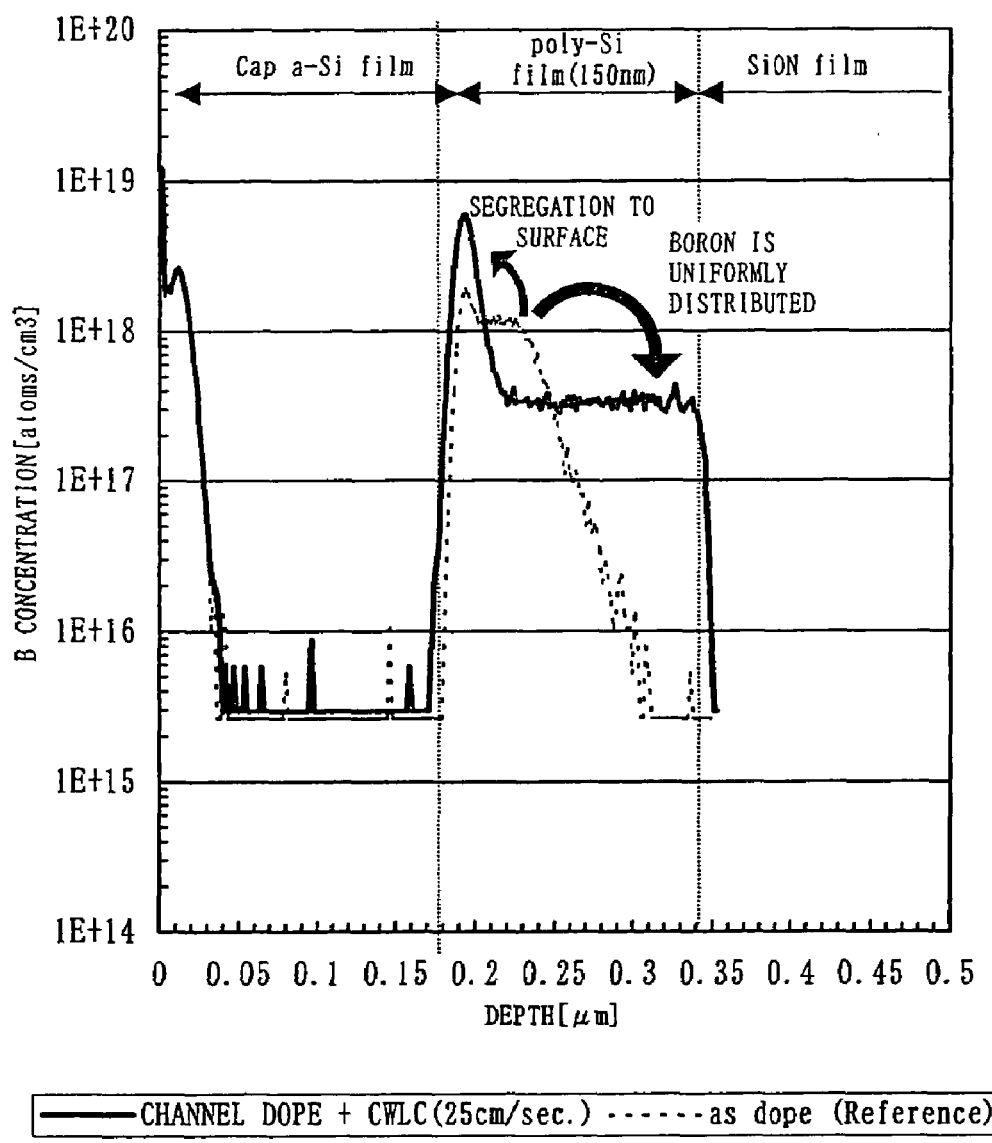
FIG. 1 is a graph showing the concentration distribution of boron implanted into a semiconductor layer before and after continuous wave laser light irradiation.
Figure 2:
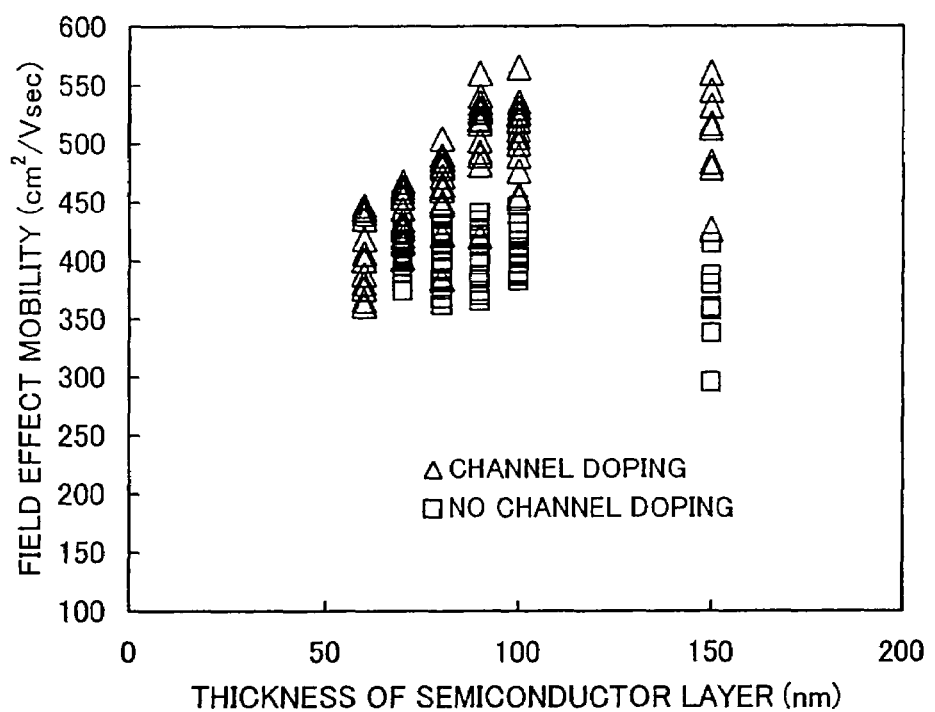
FIG. 2 is a graph showing the dependency of the TFT field effect mobility on the semiconductor layer thickness (comparison between channel doping and no channel doping)
Figure 3:
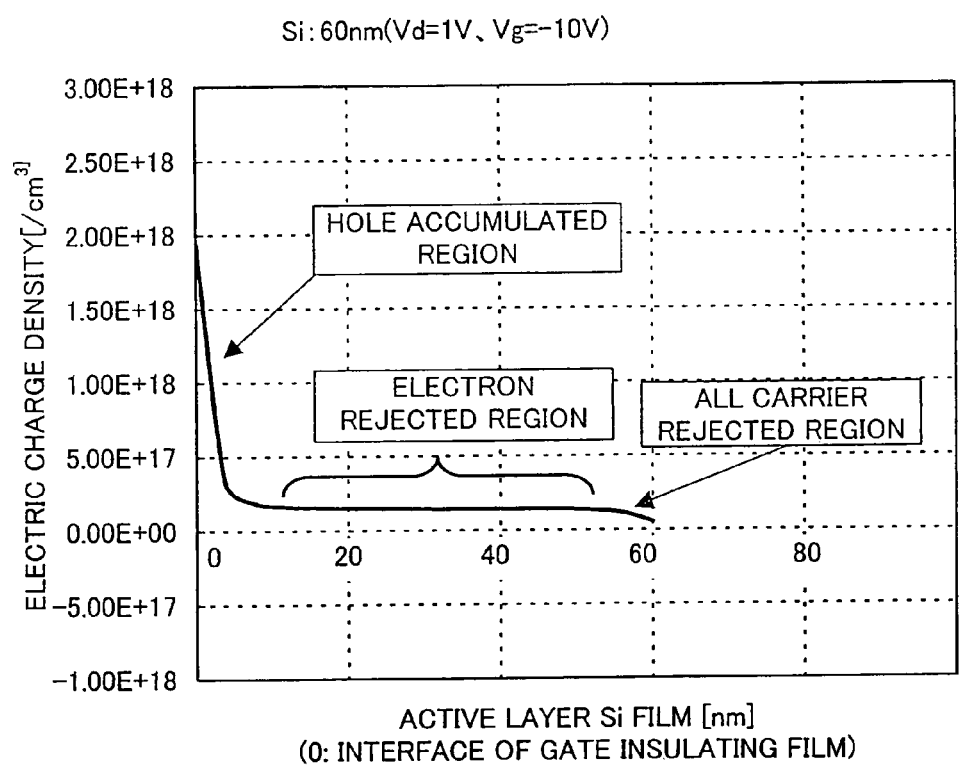
FIG. 3 is a graph showing results of a simulation on the electric charge density distribution of when a silicon film is 60 nm in thickness.
Figure 4:
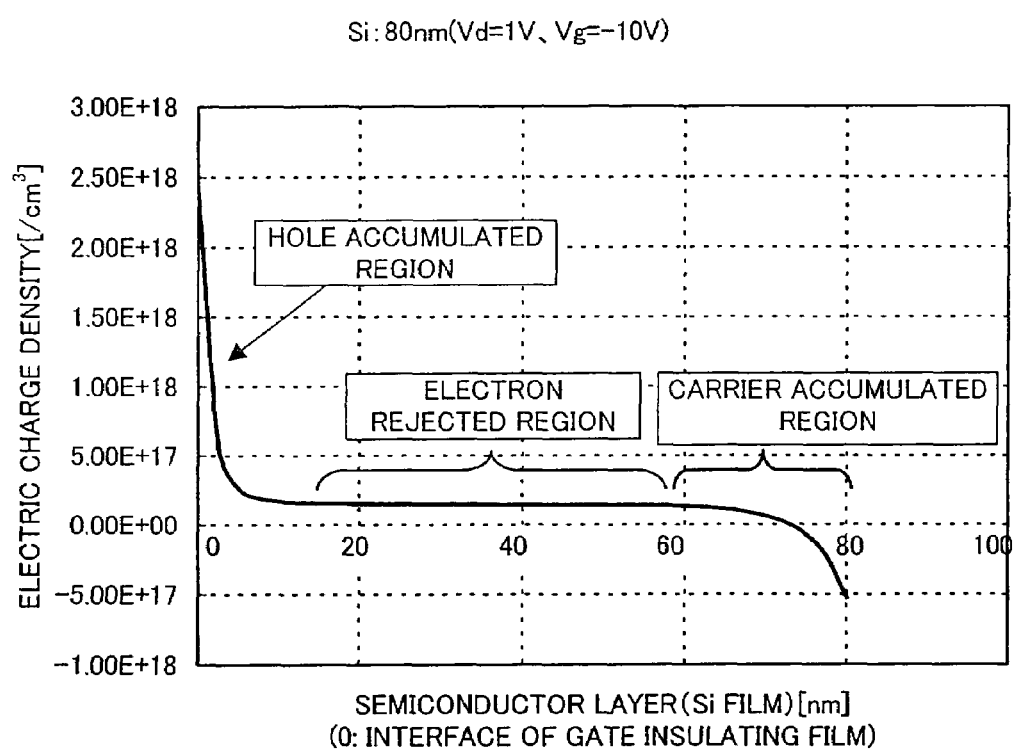
FIG. 4 is a graph showing results of a simulation on the electric charge density distribution of when a silicon film is 80 nm in thickness.
Figure 5:
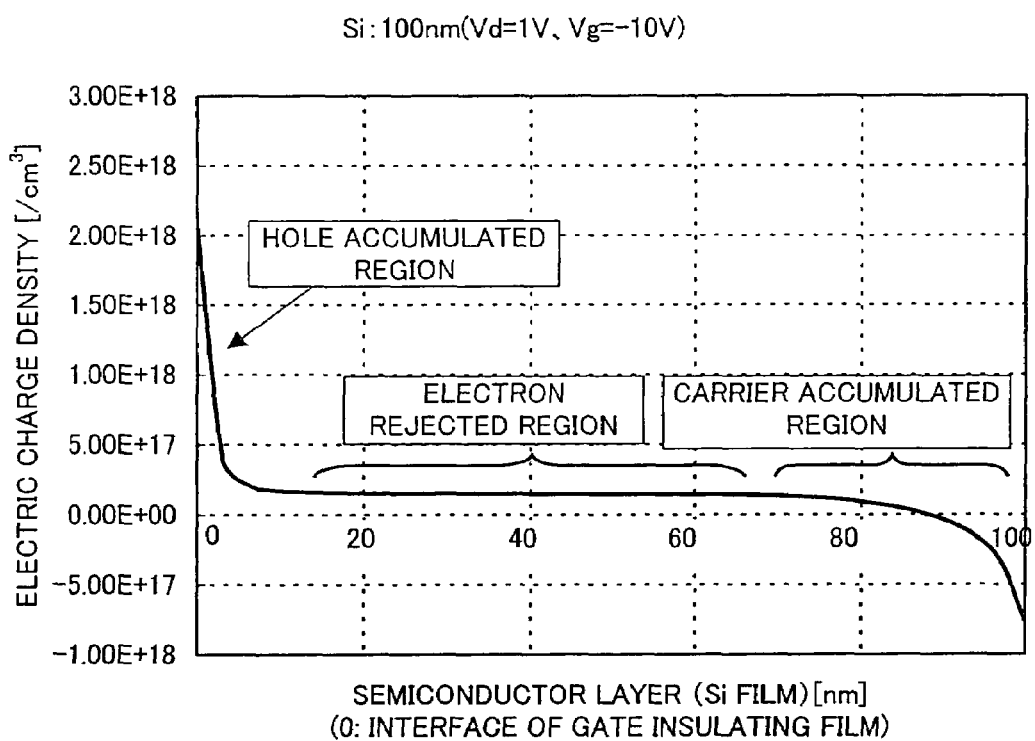
FIG. 5 is a graph showing results of a simulation on the electric charge density distribution of when a silicon film is 100 nm in thickness.
Figure 6:
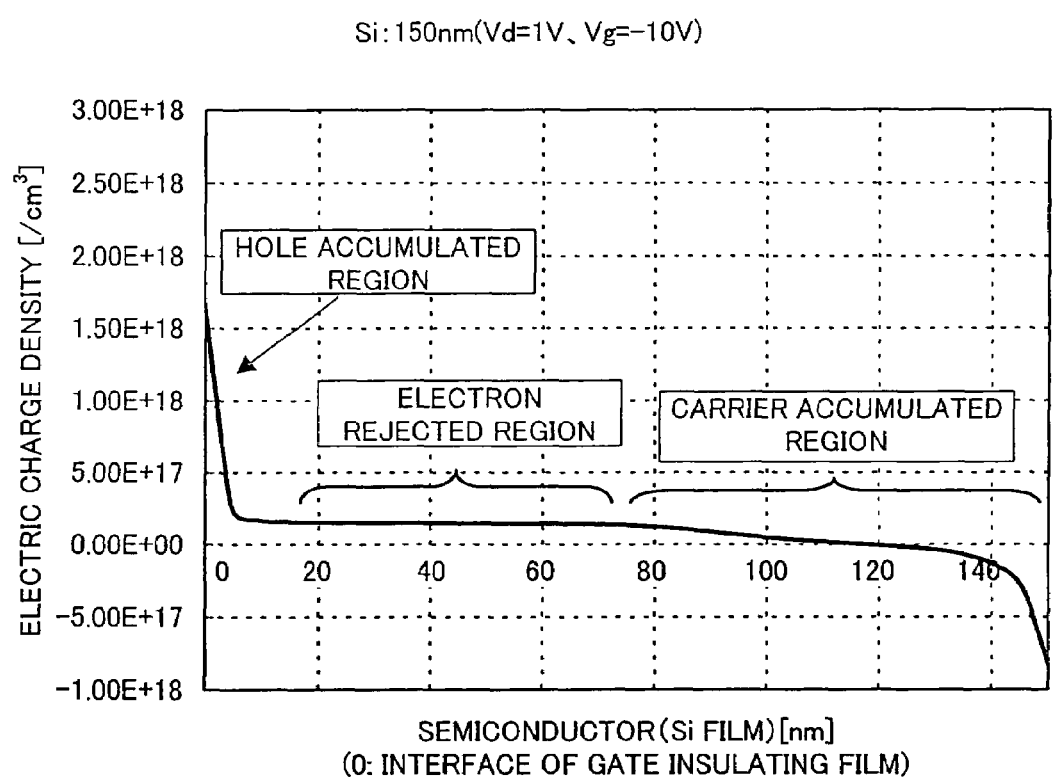
FIG. 6 is a graph showing results of a simulation on the electric charge density distribution of when a silicon film is 150 nm in thickness.

FIG. 1 shows results of measurement in which ionized boron, which is obtained by ionizing $B_2H_6$ which is diluted by $H_2$ to 1%, is implanted as an impurity of one conductivity type into a crystalline silicon film having a thickness of 150 nm at an acceleration voltage of 15 kV in a dose of $2 \times 10^{14}/cm^2$ without mass separation, and then the semiconductor layer is irradiated with continuous wave laser light, thereby measuring the concentration of boron in the film is measured by secondary ion mass spectroscopy before and after the laser irradiation. The light source of the continuous wave laser light is a $YVO_4$ laser oscillator. Second harmonic (532 nm) of this laser oscillator is used and 6 W power laser light is collected into a beam of 500 μm×20 μm. The beam runs over the irradiation surface at a rate of 25 cm/sec.

After the ion implantation, boron is distributed over a region 100 nm deep from the surface in accordance with Gaussian distribution. The boron concentration is high near the surface and is reduced toward a deeper region of the semiconductor layer. Therefore boron is not dispersed throughout the film.

The measurement results show that this situation is changed by irradiation of continuous wave laser light. The laser light irradiation re-distributes boron to make it segregate on the film surface and form a high concentration impurity region whose peak value reaches $7 \times 10^{18}/cm^3$. Formed at the same time is a region where boron is uniformly distributed in a concentration of $3.5 \times 10^{17}/cm^3$. This is a phenomenon accompanying melting and re-crystallization; since heat is released toward the substrate side, solidification starts from the interface of the base insulating film and, as a result, boron is segregated on the front side which solidifies last to form the high concentration impurity region.

The high concentration impurity region formed on the surface of the crystalline silicon film can be removed by removing a portion of the semiconductor layer that is 10 to 50 nm deep from the surface by dry etching using fluorine-based gas, or by wet etching using an alkaline solution such as hydrazine, or by chemical mechanical polishing. The above steps employ treatment temperature equal to or lower than the distortion point of a glass substrate, specifically, equal to or lower than 700° C.

The following are embodiments based on the above major mode of the present invention, although the present invention can be carried out in various different modes and that it will be easy for skilled in the art to modify the modes and details of the present invention diversely without departing from the spirit and scope of the present invention. The present invention should therefore not be interpreted solely by the accounts of the embodiments. Throughout the following descriptions of the embodiments, identical components are denoted by the same reference symbols.

Embodiment 1

Figure 7A:
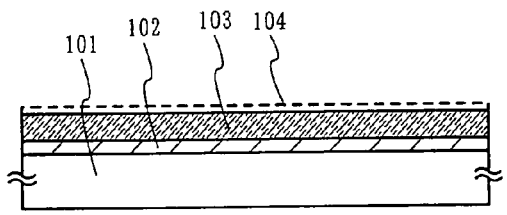
FIGS. 7A to 7E are vertical sectional views illustrating a process of manufacturing a crystalline semiconductor film in accordance with the present invention.

FIGS. 7A to 7E are diagrams illustrating a method of manufacturing a semiconductor device according to Embodiment 1 of the present invention. As shown in FIG. 7A, a base insulating film 102 is formed on a substrate 101 from a single layer or a laminate of a silicon nitride film, a silicon oxide film, and a silicon nitroxide film. The material of the substrate 101 is a commercially-available glass material called non-alkaline glass such as aluminosilicate glass. Alternatively, a semiconductor substrate such as a single crystal silicon substrate may be employed.

An amorphous semiconductor layer 103 is formed from an amorphous material such as silicon or silicon doped with germanium. The thickness of the amorphous semiconductor layer 103 is 60 to 200 nm, typically 150 nm. A metal-containing layer 104 contains a metal element having a catalytic action that makes it possible to crystallize the amorphous semiconductor layer at a temperature not higher than 600° C. and accelerates the crystallization. Such metal element is disclosed in, for example, JP 2002-124685 A.

Figure 7B:
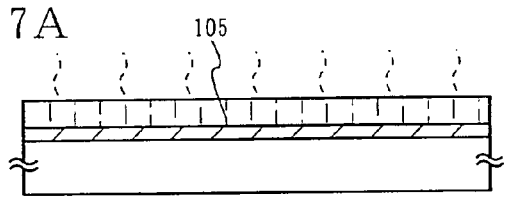

The amorphous semiconductor layer is crystallized by heating and the heating measure employed is furnace annealing, or radiant heat method or gas heat method rapid thermal annealing (RTA). The heating temperature is set to 500 to 750° C. and the heating time is 60 to 18000 seconds provided that the substrate 101 is not distorted. Formed as a result is a crystalline semiconductor layer 105 (FIG. 7B).

Figure 7C:
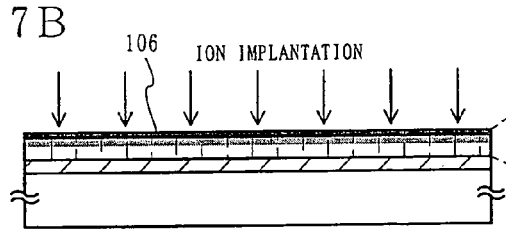
Figure 7C:
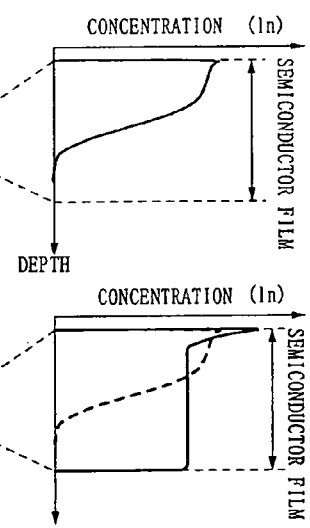

Next, as shown in FIG. 7C, ions are implanted for channel doping. When an impurity of one conductivity type is ionized and accelerated by electric filed to implant the ions into a semiconductor layer, the impurity element implanted is distributed in accordance with the acceleration voltage. If such ions are implanted at 30 kV or less as in the present invention, the concentration in an impurity implanted region 106 peaks in the vicinity of the surface and decreases as the distance from the surface is increased to form a distribution resembling Gaussian distribution as shown in an inserted diagram of FIG. 7C. The concentration of the implanted impurity is $1 \times 10^{15}$ to $5 \times 10^{18}/cm^3$ at its peak.

Channel doping in this embodiment is conducted at this stage because crystallization through heat treatment using a metal element is a reaction that utilizes silicide obtained from the metal element. In other words, conducting channel doping at this stage is desirable in this embodiment because a different kind of element distributed in the semiconductor layer hinders uniform crystallization.

Figure 7D:
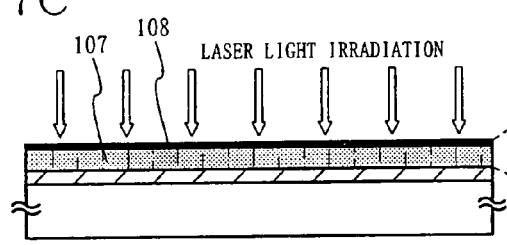
Figure 7D:
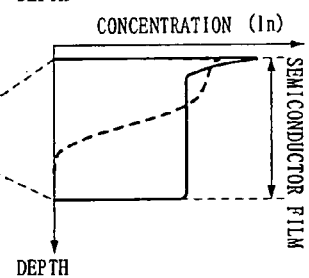

Thereafter, as shown in FIG. 7D, the crystalline semiconductor layer 105 to which the impurity has been implanted is irradiated with continuous wave laser light to melt and re-crystallize the crystalline semiconductor layer 105. Through this treatment, the impurity that has been implanted is re-distributed and segregated on the film surface to form a layer 108 which contains the one conductivity type impurity in high concentration. Formed below this high concentration layer 108 is a crystalline semiconductor layer 107 which contains the one conductivity type impurity with the concentration distribution in the depth direction being $1 \times 10^{15}$ to $5 \times 10^{18}/cm^3$ and the concentration fluctuation being ±10% (See an inserted diagram of FIG. 7D). This is a phenomenon accompanying melting and re-crystallization; since heat is released toward the substrate 101 side, solidification starts from the interface of the base insulating film and, as a result, boron is segregated on the front side which solidifies last to form the high concentration impurity region.

The layer 108 which contains the one conductivity type impurity in high concentration and which is formed on the surface is removed by etching treatment. An appropriate thickness of the layer removed is 10 to 60 nm. The remaining crystalline semiconductor layer, which is denoted by 109, is that much thinner than its initial thickness but contains the one conductivity type impurity in the above fixed concentration (FIG. 7E).

Figure 7E:
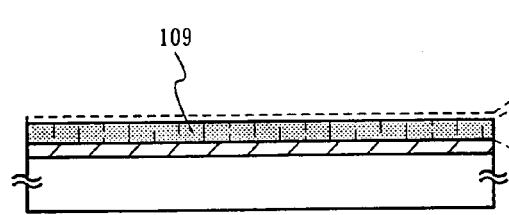
Figure 7E:
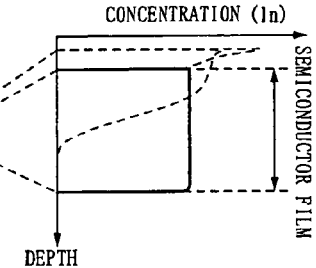

Through the process of FIGS. 7D and 7E, the metal element used in crystallization is segregated on the surface similar to the impurity of the one conductivity type. Therefore the concentration of the metal element is also reduced by this treatment.

The thus obtained crystalline semiconductor layer can be used to form major components of a field effect transistor, such as a channel formation region, source, and drain. For instance, the crystalline semiconductor layer can be used in a TFT having a gate overlap LDD structure in accordance with the technique disclosed in JP 2002-083805 A.

Embodiment 2

Figure 8A:
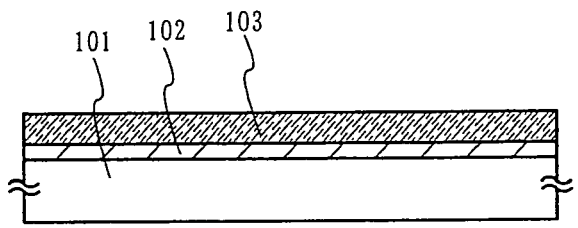
FIGS. 8A to 8D are vertical sectional views illustrating a process of manufacturing a crystalline semiconductor film in accordance with the present invention.
Figure 8B:
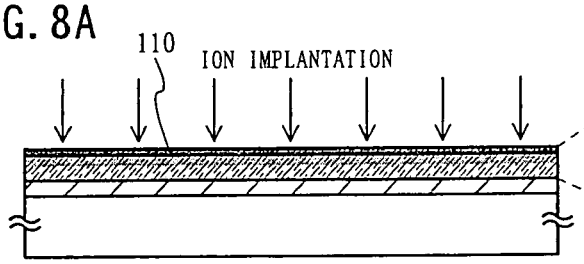

FIGS. 8A to 8D are diagrams illustrating a method of manufacturing a semiconductor device according to Embodiment 2 of the present invention. As shown in FIG. 8A, a base insulating film 102 and an amorphous semiconductor layer 103 are formed on a substrate 101.

First, ions are implanted in the amorphous semiconductor layer 103 for channel doping. When ions of an impurity of one conductivity type are accelerated by electric filed and implanted into a semiconductor layer, the impurity element implanted is distributed in accordance with the acceleration voltage. With such ions implanted at 30 kV or less, the concentration in an impurity implanted region 110 peaks in the vicinity of the surface and decreases as the distance from the surface is increased to form a distribution resembling Gaussian distribution as shown in an inserted diagram of FIG. 8B. The concentration of the implanted impurity in the semiconductor layer is $1 \times 10^{15}$ to $5 \times 10^{18}/cm^3$ at its peak.

Figure 8C:
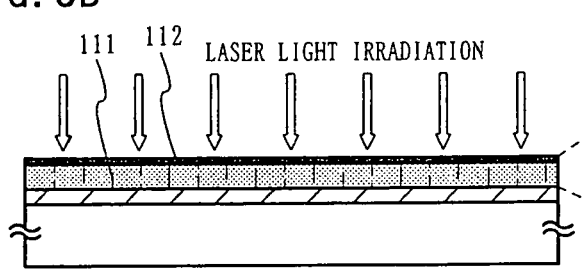

Thereafter, as shown in FIG. 8C, the amorphous semiconductor layer 103 to which the impurity has been implanted is irradiated with continuous wave laser light to melt and crystallize the amorphous semiconductor layer 103. Formed as a result is a crystalline semiconductor layer 111. Through this treatment, the impurity that has been implanted is re-distributed and segregated on the film surface to form a layer 112 which contains the one conductivity type impurity in high concentration. Below this high concentration layer 112, the one conductivity type impurity is distributed uniformly similar to Embodiment 1 (See an inserted diagram of FIG. 8C).

Figure 8D:
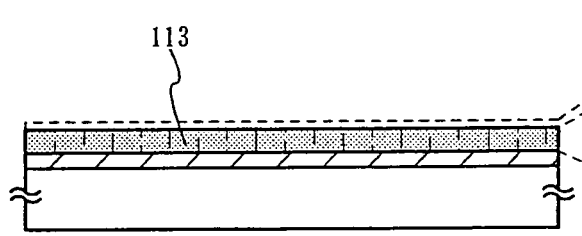

The layer 112 which contains the one conductivity type impurity in high concentration and which is formed on the surface is removed by etching treatment. An appropriate thickness of the layer removed is 10 to 60 nm. The remaining crystalline semiconductor layer, which is denoted by 113, is that much thinner than its initial thickness but contains the one conductivity type impurity in a concentration of $1 \times 10^{15}$ to $5 \times 10^{18}/cm^3$ with the concentration fluctuation contained within ±10% (FIG. 8D).

The thus obtained crystalline semiconductor layer can be used to form major components of a field effect transistor, such as a channel formation region, source, and drain. For instance, the crystalline semiconductor layer can be used in a TFT having a gate overlap LDD structure in accordance with the technique disclosed in JP 2002-083805 A.

Embodiment 3

Figure 9A:
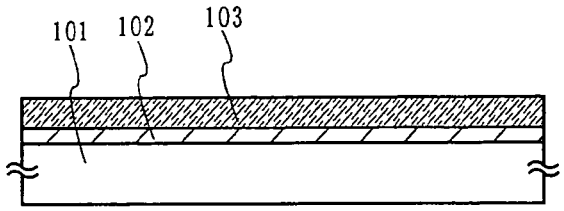
FIGS. 9A to 9E are vertical sectional views illustrating a process of manufacturing a crystalline semiconductor film in accordance with the present invention.

FIGS. 9A to 9E are diagrams illustrating a method of manufacturing a semiconductor device according to Embodiment 3 of the present invention. As shown in FIG. 9A, a base insulating film 102 and an amorphous semiconductor layer 103 are formed on a substrate 101.

Figure 9B:
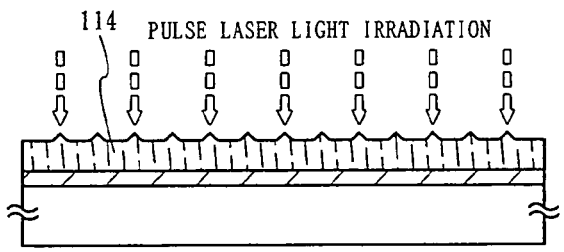

First, the amorphous semiconductor layer 103 is irradiated with pulse laser light to be crystallized. The light source of the pulse laser light can be a pulse oscillation gas laser or solid-state laser. Specifically, an excimer laser oscillator, a YAG laser oscillator, a YVO$_4$ laser oscillator, a YLF laser oscillator, or the like is employable. The oscillation frequency is set to 10 to 300 Hz and the oscillation pulse width is set to 20 to 100 nsec. A region of the amorphous semiconductor layer that is irradiated with the pulse laser light is partially or entirely melted and crystallized. The resultant crystalline semiconductor film, which is denoted by 114, has an irregular surface and the largest level difference equals the thickness of the film. The loss of surface levelness is a common phenomenon in use of pulse laser light (FIG. 9B).

Figure 9C:
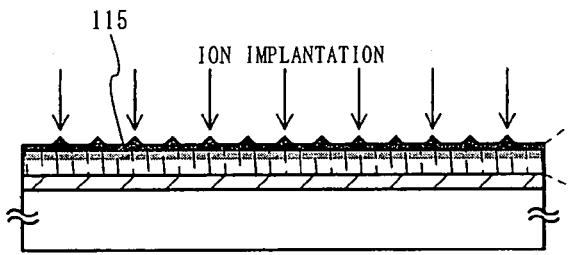

Thereafter, ions are implanted for channel doping (FIG. 9C). When an impurity of one conductivity type is ionized and accelerated by electric filed to implant the ions into a semiconductor layer, the impurity element implanted is distributed in accordance with the acceleration voltage. If such ions are implanted at 30 kV or less as in the present invention, the concentration in an impurity implanted region 115 peaks in the vicinity of the surface and decreases as the distance from the surface is increased to form a distribution resembling Gaussian distribution as shown in an inserted diagram of FIG. 9C. The concentration of the implanted impurity in the semiconductor layer is $1 \times 10^{15}$ to $5 \times 10^{18}/cm^3$ at its peak.

Figure 9D:
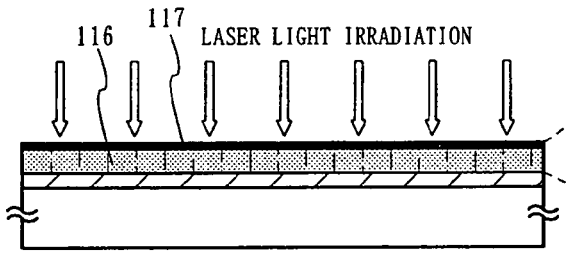

Then, as shown in FIG. 9D, the crystalline semiconductor layer 115 to which the impurity has been implanted is irradiated with continuous wave laser light to melt and re-crystallize the crystalline semiconductor layer 115. Through this treatment, the impurity that has been implanted is re-distributed and segregated on the film surface to form a layer 117 which contains the one conductivity type impurity in high concentration. Formed below this high concentration layer 117 is a crystalline semiconductor layer 116 which contains the one conductivity type impurity with the concentration distribution in the depth direction being $1\times10^{15}$ to $5\times10^{18}/\text{cm}^3$ and the concentration fluctuation being ±10%. The surface of the crystalline semiconductor film is leveled through this melting and re-crystallization process (See an inserted diagram of FIG. 9D).

Figure 9E:
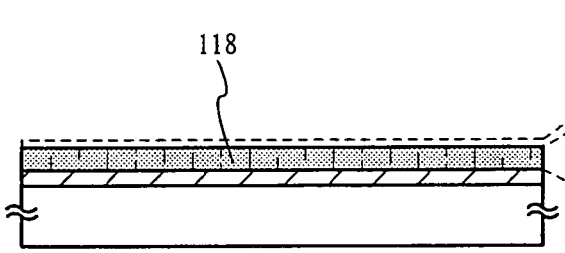

The layer 117 which contains the one conductivity type impurity in high concentration and which is formed on the surface is removed by etching treatment. An appropriate thickness of the layer removed is 10 to 60 nm. The remaining crystalline semiconductor layer, which is denoted by 118, is that much thinner than its initial thickness but contains the one conductivity type impurity in the above fixed concentration (FIG. 9E).

Similar to the preceding embodiments, the crystalline semiconductor film formed in this embodiment can be used to manufacture a TFT. Such TFT can be built on a substrate having an insulating surface, and various semiconductor devices including an active matrix liquid crystal display device can be manufactured from the substrate.

Embodiment 4

Embodiment 4 of the present invention shows an example of manufacturing a TFT from a crystalline semiconductor layer that is formed in one of Embodiments 1 through 3.

A crystalline silicon film is formed on a base insulating film 102 on a substrate 101 in accordance with one of Embodiments 1 through 3. The crystalline silicon film is etched to have a desired shape and form semiconductor layers 201 to 203 which are isolated from one another like islands. The semiconductor layers 201 to 203 form a channel formation region, source and drain regions, a low concentration impurity region, and the like to serve as major components of a TFT. In etching the crystalline silicon film, dry etching is employed and mixture gas of $CF_4$ and $O_2$ is chosen as etching gas. The semiconductor layers 201 to 203 are tapered by the etching treatment at an angle of 30 to 60° in order to give a gate insulating film better coverage.

On the semiconductor layers 201 to 203, a silicon oxide film 204 and a silicon nitride film 205 which constitute the gate insulating film are formed by high frequency magnetron sputtering. Immediately, a first conductive film 206 and a second conductive film 207 which constitute a gate electrode are formed so that these four layers are successively formed under reduced pressure while avoiding exposure to the air.

The surfaces of the semiconductor layers 201 to 203 are cleaned and smoothed by oxidizing treatment with an aqueous solution containing ozone water and by oxide film removing treatment with an aqueous solution containing hydrofluoric acid. Then the surfaces of the semiconductor layers are etched to remove their superficial layers. Through this treatment, the outermost surfaces of the semiconductor layers 201 to 203 are etched away and clean, inactive surfaces terminated by hydrogen are obtained. Formation of the gate insulating film employs heat treatment at 100 to 200° C. in order to release moisture in the substrate as well as one clung to the substrate surface and clean the surface.

The gate insulating film in this embodiment has a two-layer structure consisting of the silicon oxide film 204 and the silicon nitride film 205 which are formed by high frequency magnetron sputtering using silicon as target. Major conditions in forming the silicon oxide film include using $O_2$ and Ar for sputtering gas, setting the substrate heating temperature to 100 to 200° C., and setting the film thickness to 10 to 60 nm. The silicon oxide film 204 obtained under these conditions is low in interface level density with respect to the semiconductor layers and has a dense texture. The silicon nitride film 205 is also formed by heating at 100 to 200° C. to a thickness of 10 to 30 nm using $N_2$ and Ar for sputtering gas. Silicon oxide has a specific inductive capacity of 3.8 whereas the specific inductive capacity of silicon nitride is about 7.5. Therefore, when a silicon nitride film is added to a silicon oxide film as a gate insulating film, the effect it provides is substantially the same as when the gate insulating film is thinned. By giving a gate insulating film a two-layer structure consisting of a silicon oxide film and a silicon nitride film, the gate leak current is reduced and the TFT can be driven at 2.5 to 10 V, typically, 3.0 to 5.5 V even when the total thickness of the gate insulating film is 30 to 80 nm.

As described, a gate insulating film having a two-layer structure is employed in this embodiment. Instead, a silicon oxide film formed by plasma CVD using TEOS or a silicon nitroxide film formed by reaction between $SiH_4$ and nitroxide gas may be used for the gate insulating film.

Contaminants at the interface between the gate insulating film and the gate electrode could cause a change in threshold voltage. This is the reason why formation of the gate insulating film is immediately followed by formation of a laminate of the first conductive film 206, which is formed of tantalum nitride (TaN) to a thickness of 10 to 50 nm, and the second conductive film 207, which is formed of tungsten (W) to a thickness of 100 to 400 nm.

The gate electrode is obtained by processing this laminate. Other material that can be employed is an element selected from the group consisting of Ta, W, Ti, Mo, Al, and Cu, or an alloy material or compound material mainly containing the element. A semiconductor layer, typically a polycrystalline silicon film doped with an impurity element such as phosphorus, may also be used for the gate electrode. The following combinations of the first conductive film and the second conductive film are also employable: a tantalum (Ta) film as the first conductive film and a W film as the second conductive film; a tantalum nitride (TaN) film as the first conductive film and an Al film as the second conductive film; and a tantalum nitride (TaN) film as the first conductive film and a Cu film as the second conductive film.

Figure 10A:
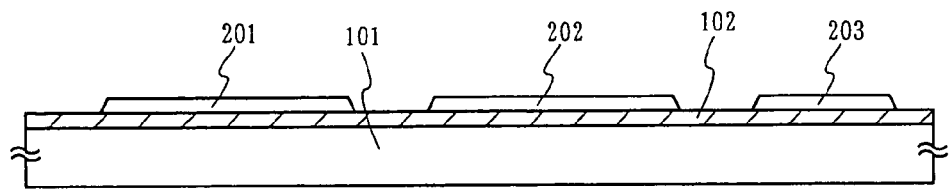
FIGS. 10A to 10E are vertical sectional views illustrating a process of manufacturing a TFT in the present invention.
Figure 10B:
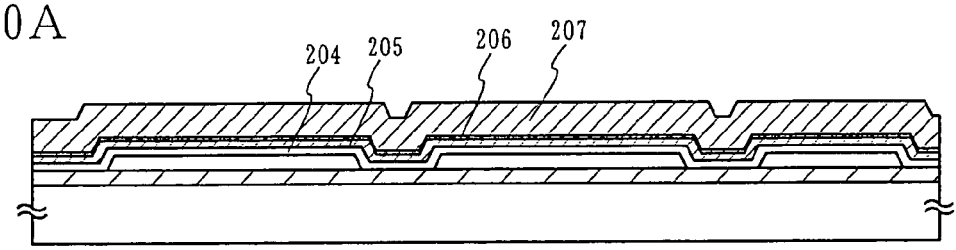
Figure 10C:
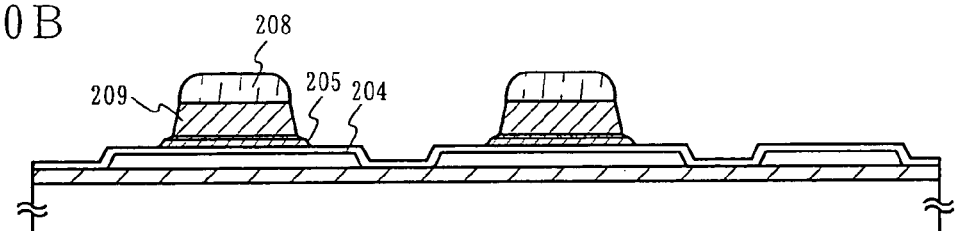

Next, as shown in FIG. 10C, a resist mask 208 is formed by photo etching to form a pattern of the gate electrode. Then dry etching is used for the first etching treatment. No limitation is put on etching gas but a mixture of $CF_4$, $Cl_2$, and $O_2$ is preferred for etching of W film and TaN film. In the first etching treatment, a given bias voltage is applied to the substrate side to make side faces of a first shape gate electrode pattern 209 slanted at an angle of 15 to 50°. Although depending on etching conditions, the silicon nitride film 205 formed as the gate insulating film through the first etching treatment remains below the first shape gate electrode pattern 209 while the silicon oxide film 204 is exposed in the other regions.

Figure 10D:
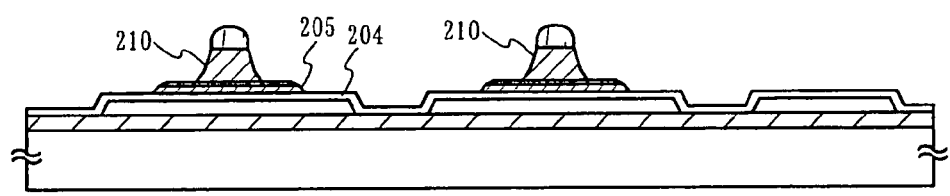

Thereafter, the etching conditions are switched to second etching conditions, which include using $SF_6$, $Cl_2$, and $O_2$ for etching gas, setting the bias voltage to be applied to the substrate side to a given level, and subjecting the W film to anisotropic etching. Thus formed is a gate electrode 210. Then the resist mask 208 is removed (FIG. 10D).

Figure 10E:
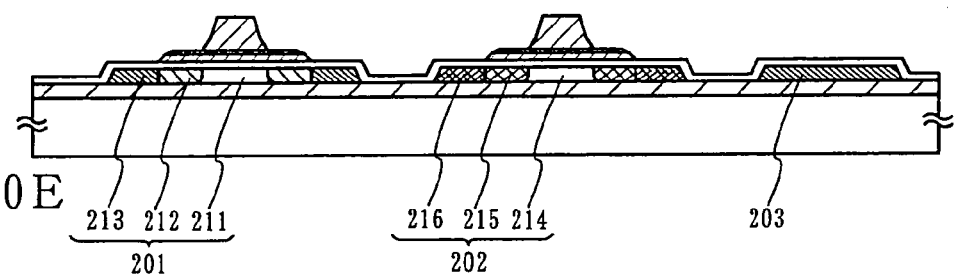

The gate electrode is a laminate of the first conductive film 206 and the second conductive film 207, and has a hat shape in which the first conductive film 206 projects like an eave. As shown in FIG. 10E, impurity regions are formed in the respective semiconductor layers through doping treatment. The doping conditions are set suitably. A first n type impurity region 212 and a second n type impurity region 213 are formed in the semiconductor layer 201 and serve as low concentration drain and a source or drain region, respectively. A first p type impurity region 215 and a second p type impurity region 216 are formed in the semiconductor layer 202 and serve as source or drain that overlaps the gate electrode and a source or drain region, respectively. Channel formation regions 211 and 214 in the semiconductor layers 201 and 202 are formed at positions that substantially overlap the second conductive film of the gate electrode 210. The semiconductor layer 203 is used to form a capacitor portion and is doped with an impurity in a concentration equal to the impurity concentration of the second n type impurity region or the second p type impurity region.

Figure 11A:
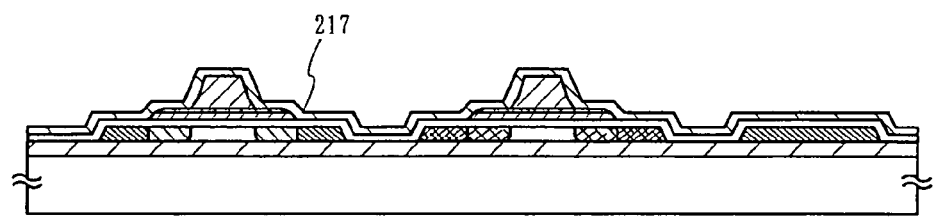
FIGS. 11A to 11C are vertical sectional views illustrating a process of manufacturing a TFT in the present invention.

Then, as shown in FIG. 11A, a silicon oxynitride film 217 containing hydrogen is formed by plasma CVD to a thickness of 50 nm and the semiconductor layers are hydrogenated by heat treatment at 350 to 550° C.

Figure 11B:
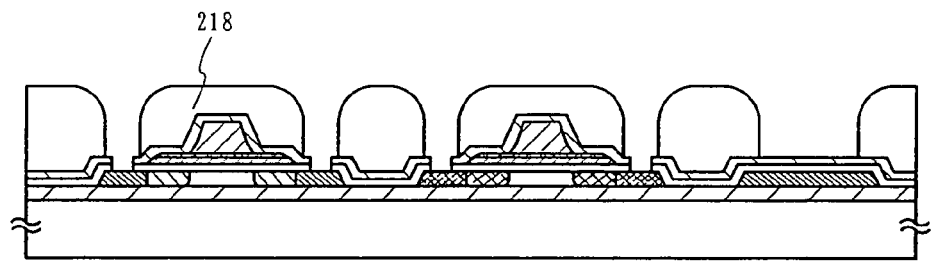

An interlayer insulating film 218 is formed from a photo-sensitive organic resin material that mainly contains acrylic or polyimide, and is patterned to have a given shape. Then contact holes 277 are formed by dry etching (FIG. 11B).

Figure 11C:
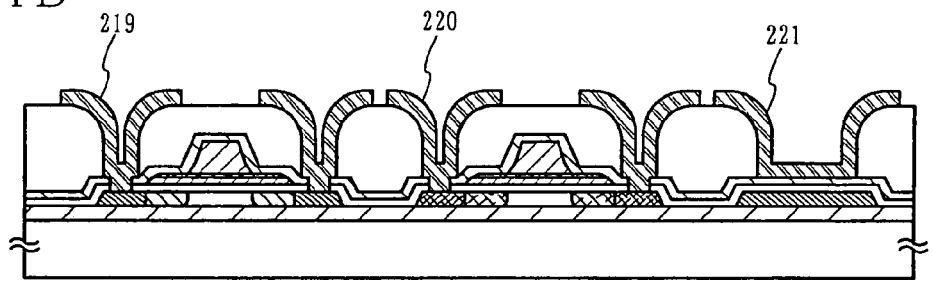

Thereafter, wires 219 to 221 are formed from Al, Ti, Mo, W, or the like as shown in FIG. 11C. To give an example of the wire structure, a Ti film with a thickness of 50 to 250 nm and an alloy film (Al—Ti alloy film) with a thickness of 300 to 500 nm are layered and the laminate is used for the wires.

Thus formed are an n-channel TFT 301, a p-channel TFT 302, and a capacitor portion 303. The gate insulating film in each of the TFTs includes at least one layer of silicon nitride film. The capacitor portion 303 includes at least one layer of silicon nitride film as a dielectric film.

Embodiment 5

This embodiment shows an example of manufacturing an active matrix liquid crystal display device or an active matrix EL display device using the TFT that is obtained in Embodiment 4.

Figure 12:
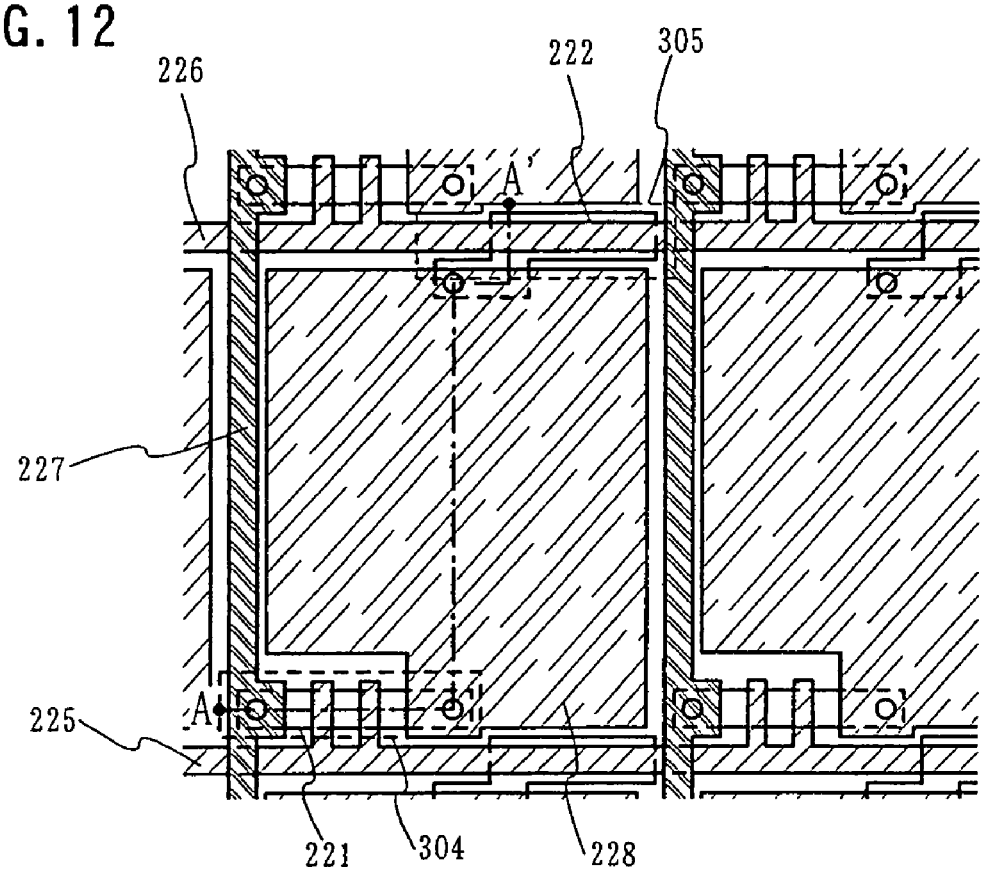
FIG. 12 is a top view showing the structure of a pixel of a liquid crystal display device that is manufactured in accordance with the present invention.
Figure 13A:
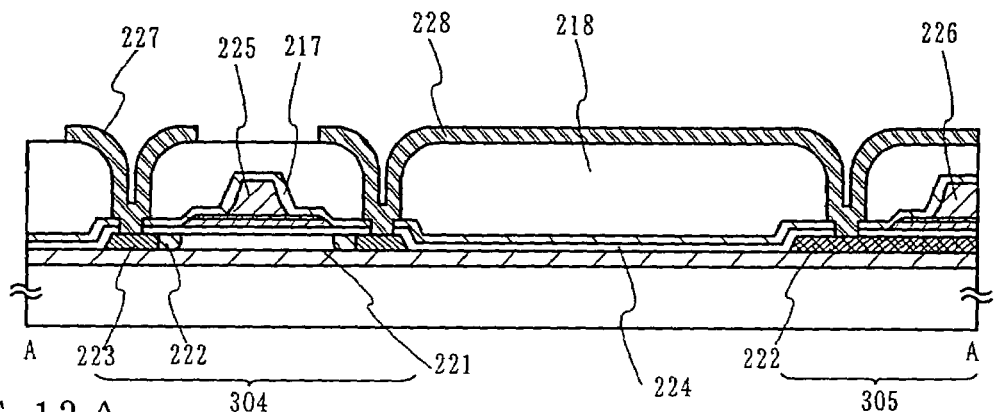
FIGS. 13A and 13B are vertical sectional views showing the structure of a pixel of a liquid crystal display device that is manufactured in accordance with the present invention.
Figure 13B:
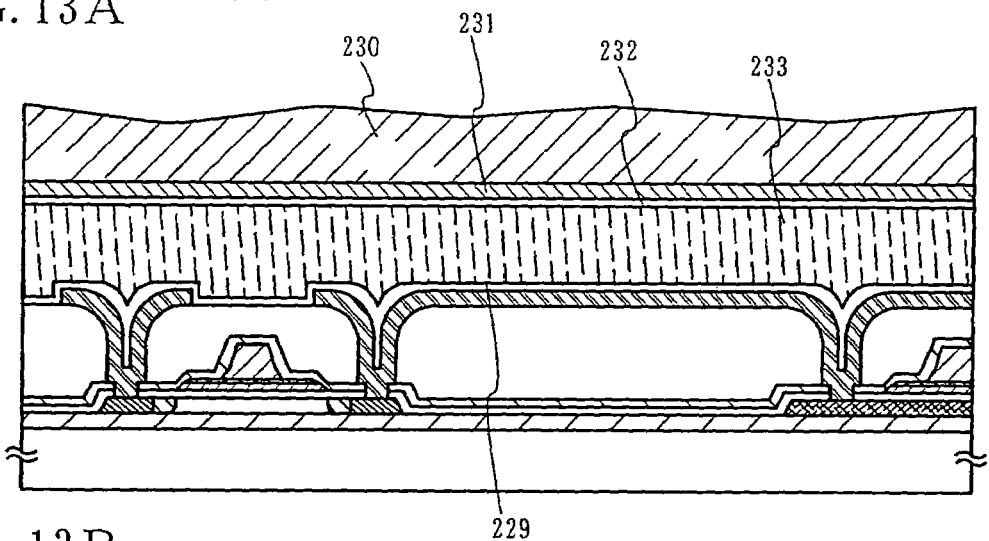

FIG. 12 is a top view showing an example of building a pixel of a liquid crystal display device from a TFT that uses a crystalline semiconductor layer of the present invention. FIGS. 13A and 13B are vertical sectional views taken along the line A-A' in FIG. 12.

FIG. 12 shows a mode which has as major components of the pixel a scanning signal line 225, a data signal line 227, and a capacitor storage portion 305 in addition to a TFT 304 and a pixel electrode 228 connected to the TFT 304. In the vertical sectional views of FIGS. 13A and 13B, the TFT 304 has an LDD structure. The manufacture process of this TFT is similar to the one in Embodiment 4 but a semiconductor layer 221 of this TFT has a source or drain region 223 and a lightly doped drain region 222 to form an LDD structure (the manufacture process is disclosed in JP 2002-324808 A). The capacitor storage portion 305 is composed of a semiconductor layer 222 and an overlap portion where a silicon oxide film 224 which is on the same layer as a gate insulating film overlaps the scanning signal line 226. An interlayer insulating film is composed of a silicon nitride film 217 and an organic resin film 218. The data signal line 227 and the pixel electrode 228 are formed above the interlayer insulating film. FIG. 13B shows a state after a liquid crystal 233 is sealed. A common electrode 231 is formed on an opposite substrate 230 and the liquid crystal 233 is sandwiched between orientated films 229 and 232.

Figure 14:
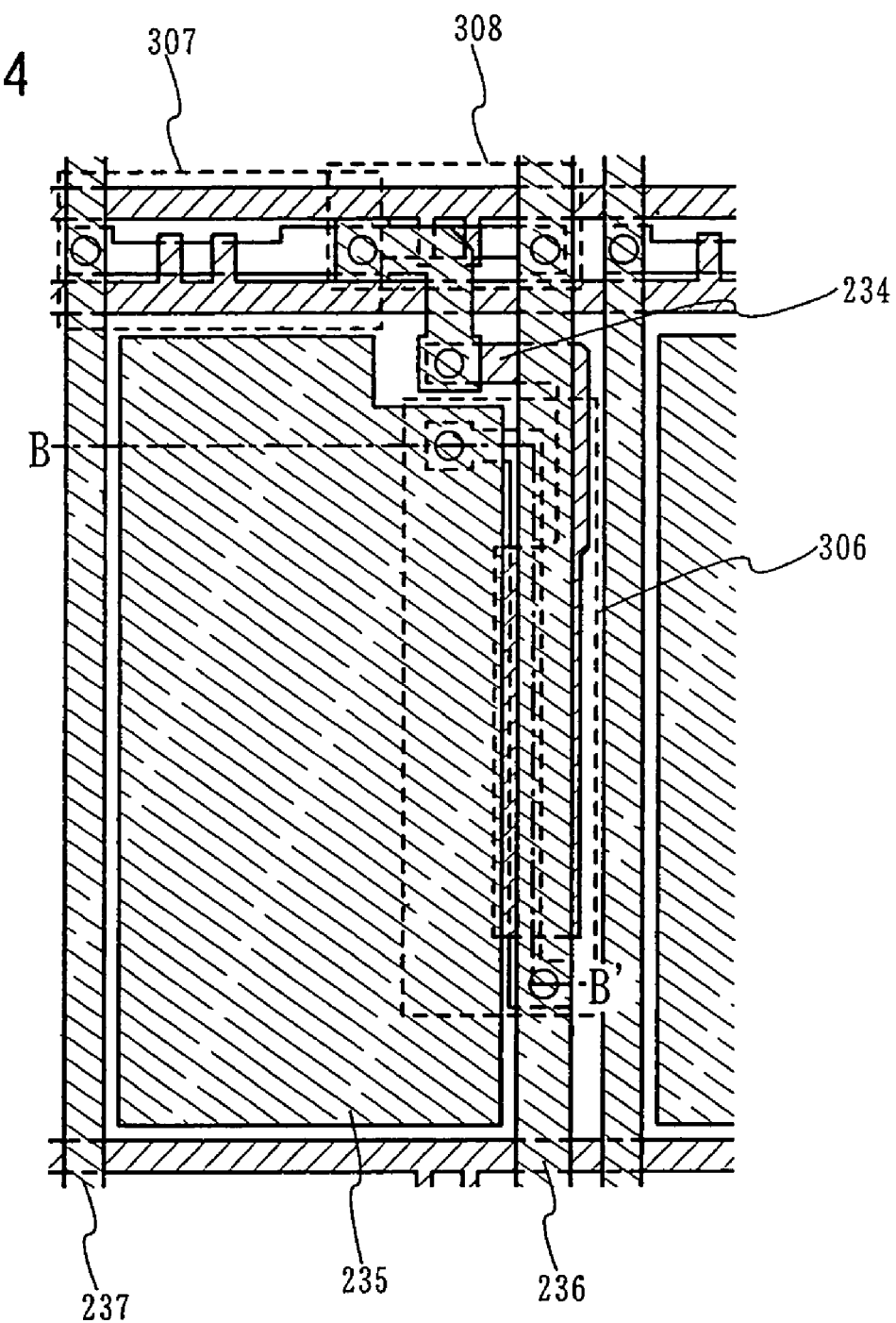
FIG. 14 is a top view showing the structure of a pixel of an EL display device that is manufactured in accordance with the present invention.
Figure 15A:
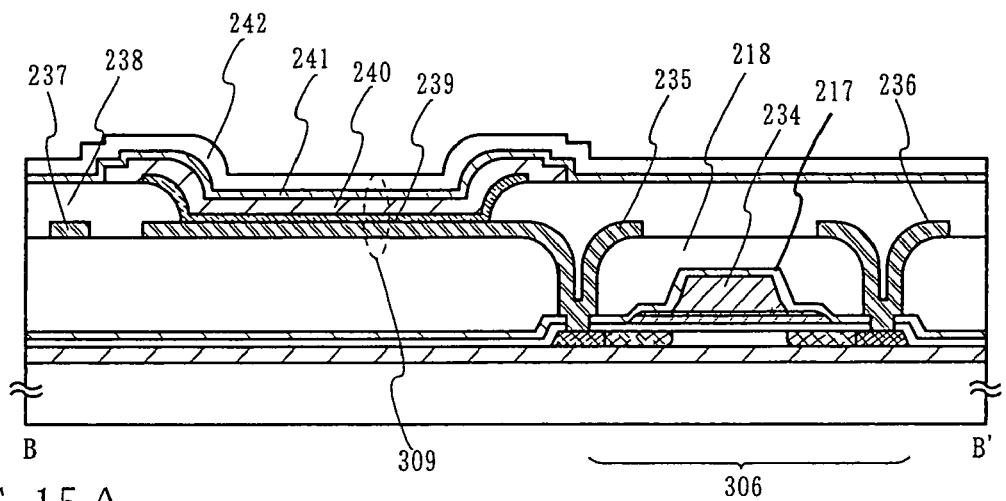
FIGS. 15A and 15B are vertical sectional views showing the structure of a pixel of an EL display device that is manufactured in accordance with the present invention.
Figure 15B:
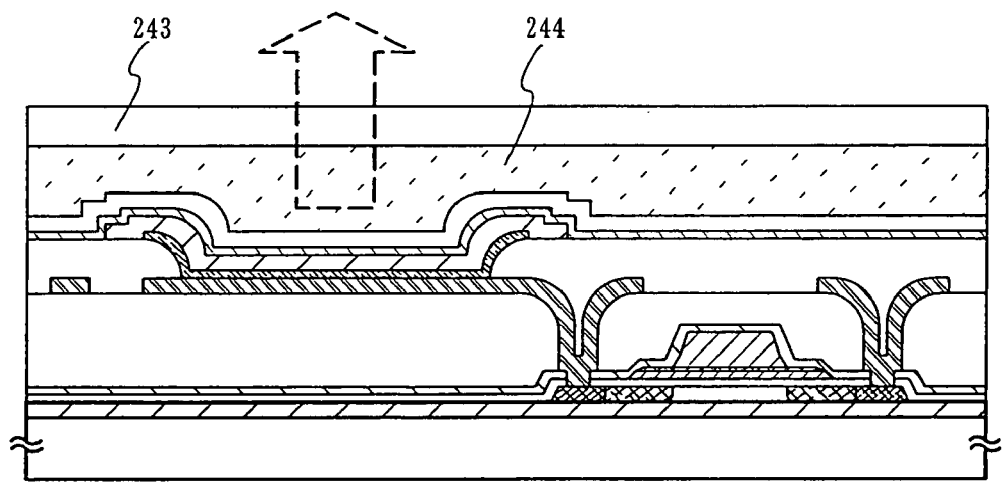

FIG. 14 is a top view showing an example of building a pixel of an EL display device from a TFT that uses a crystalline semiconductor layer of the present invention. FIGS. 15A and 15B are vertical sectional views taken along the line B-B' in FIG. 14.

The pixel shown in FIG. 14 has three TFTs, namely, TFTs 306 to 308. The TFT 306 is connected to a pixel electrode 235 and a power supply line 236. The TFT 307 is connected to a data signal line 237. The TFT 308 is connected to the power supply line 236. In this pixel structure, the TFT 306 is a driving TFT which is connected to an EL element whereas the TFTs 307 and 308 are switching TFTs for controlling signals. A detailed structure of the TFT 306, which is a particularly major component, is shown in FIG. 15A, a vertical sectional view taken along the line B-B'. The TFT 306 is a p-channel TFT and is obtained through a manufacture process that is similar to the one in Embodiment 4. Its interlayer insulating film is composed of a silicon nitride film 217 and an organic resin film 218. The power supply line 236 and the pixel electrode 235 are formed above the interlayer insulating film.

An EL element 309 is composed of a metal layer 239, an EL layer 240, and a metal layer 241. The metal layer 239 is formed on the pixel electrode 235 from titanium nitride, for example, has a work function of 4 eV or more, and does not transmit light. The EL layer 240 is formed of an organic compound, or a laminate or mixture of an organic compound and an inorganic compound. The metal layer 241 has a work function of 4 eV or less and transmits light. On the EL element 309, a protective film 242 is formed from a silicon nitride film, an aluminum oxide film, or an aluminum oxynitride film. A preferred protective film is a silicon nitride film formed by high frequency sputtering. The structure shown in FIG. 15 is of when a sealing plate 243 is fixed. A light-transmissive resin layer 244 is formed between the sealing plate 243 and the protective film 242. The above silicon nitride film as the protective film 242 can prevent organic-based gas, oxygen, and moisture which are released from the resin layer 218 from entering the EL element 309.

Figure 16:
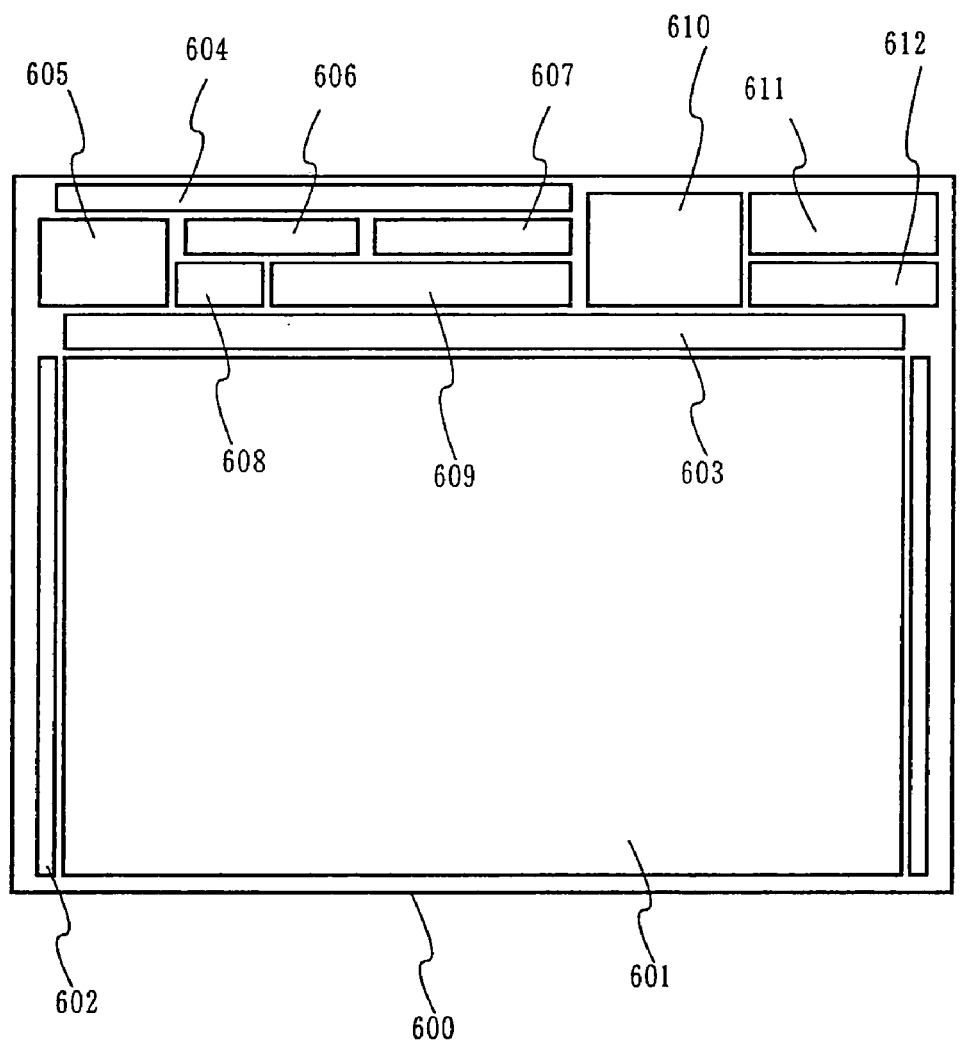
FIG. 16 is a block diagram showing the structure of a display device that is manufactured in accordance with the present invention.

FIG. 16 is a diagram showing the structure of a display device 600 which has such pixel. The display device 600 has a pixel portion 601, a scanning line signal driving circuit 602, and a data line signal driving circuit 603. The pixel portion 601 displays an image by light emitted from electro-optical action of a liquid crystal or from an EL layer. The display device 600 may also have an I/O port 604, a CPU 605, a serial interface 606, a power supply circuit 607, a RAM 608, an image signal control circuit 609, a video RAM 610, a DAC/ADC 611, a timer counter circuit 612, etc., and these can be integrally formed on the same glass substrate from TFTs that use a crystalline semiconductor layer of the present invention.

Embodiment 6

Figure 17:
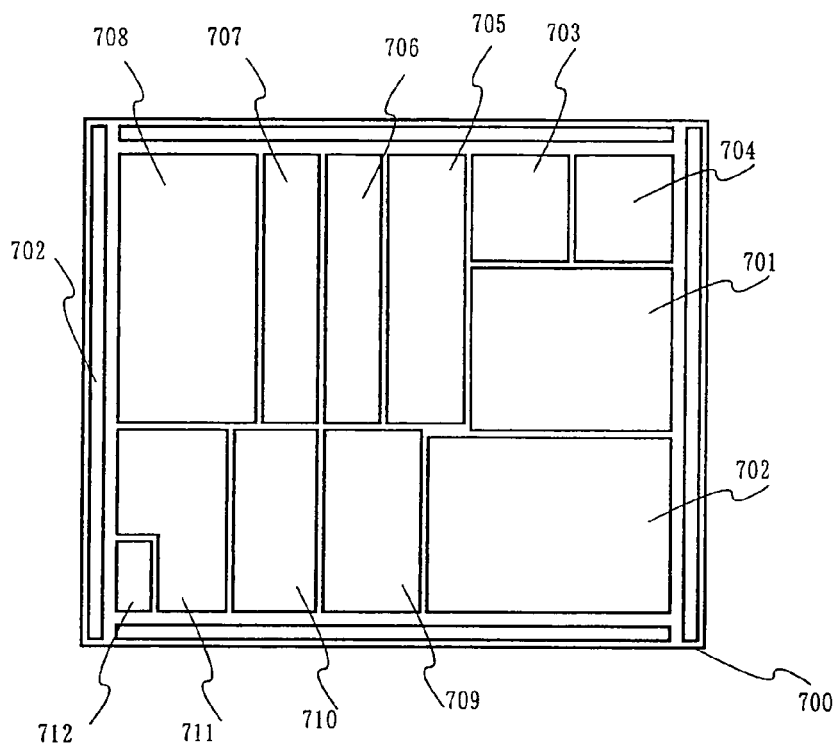
FIG. 17 is a block diagram showing a mode of a microcomputer that is manufactured in accordance with the present invention.

A mode of a microcomputer is described with reference to FIGS. 17 and 18 as a typical semiconductor device manufactured in accordance with the present invention. As shown in FIG. 17, a various functional circuit portions are integrated on a glass substrate which is 0.1 to 1.1 mm in thickness to obtain a microcomputer Those various functional circuit portions can have as their major parts TFTs and capacitor portions that are manufactured in accordance with Embodiments 1 through 4.

Components of a microcomputer 700 shown in FIG. 17 include a CPU 701, a ROM 702, an interruption controller 703, a cache memory 704, a RAM 705, a DMAC 706, a clock generator circuit 707, a serial interface 708, a power generator circuit 709, an ADC/DAC 710, a timer counter 711, a WDT 712, and an I/O port 702.

Figure 18:
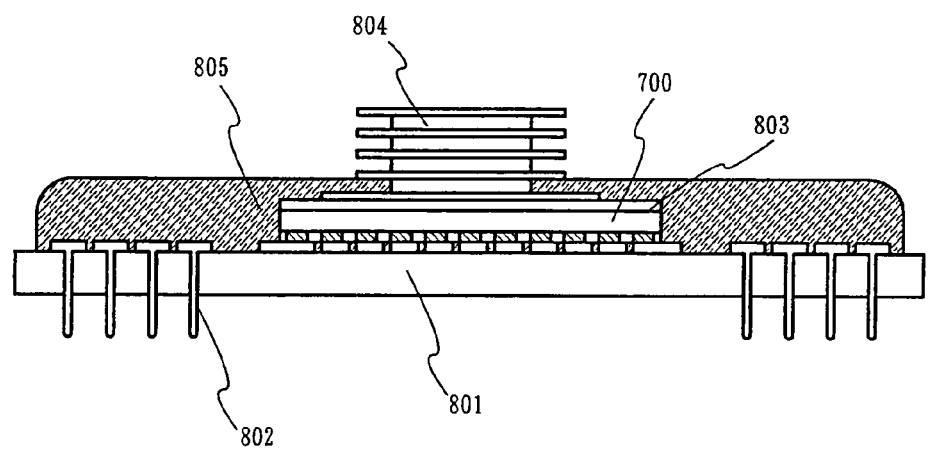
FIG. 18 is a sectional view showing a mode of a microcomputer that is manufactured in accordance with the present invention.

The microcomputer 700 formed on a glass substrate is fixed by facedown bonding to a base 801 made of ceramic or FRP (fiber reinforced plastic) as shown in FIG. 18. The rear side of the glass substrate of the microcomputer 700 is covered with a heat conductive layer 803 formed of aluminum oxide, aluminum nitroxide, boron nitride, diamond carbon, or the like to enhance the heat dissipating effect. Furthermore, a heat releasing fin 804 formed of aluminum is provided and brought into contact with the heat conductive layer 803 to deal with heat generated as the microcomputer 700 is put into operation. The microcomputer 700 is entirely covered with sealing resin 805 and is connected to an external circuit through a pin 802.

This embodiment shows a mode of a microcomputer as an example. The present invention can be used to build semiconductor devices of various functions such as media processors, graphic LSIs, encoder LSIs, memories, and cellular phone LSIs by changing the structure and combination of various functional circuits.

With the above structure of the present invention, an impurity of one conductivity which is used to dope a channel formation region of a crystalline semiconductor layer for forming a TFT can be distributed in a fixed concentration along the depth of the semiconductor layer. Accordingly, a field effect transistor that is reduced in off leak current and has high field effect mobility is obtained.

What is claimed is:

1. A method of manufacturing a semiconductor device, comprising:
   forming an amorphous semiconductor layer over a substrate;
   introducing an impurity element of one conductivity type into an upper surface portion of the amorphous semiconductor layer;
   irradiating the amorphous semiconductor layer with a laser light to obtain a crystalline semiconductor layer;
   removing the upper surface portion of the crystalline semiconductor layer, after irradiating the amorphous semiconductor layer with the laser light;
   patterning a remaining portion of the crystalline semiconductor layer to obtain a crystalline semiconductor layer having an island shape; and
   forming a channel portion of an insulated gate field effect transistor from the crystalline semiconductor layer having the island shape,
   wherein the crystalline semiconductor layer having the island shape comprises the impurity element.

2. A method of manufacturing a semiconductor device according to claim 1, wherein 10 to 40 nm of the thickness of the upper surface portion is removed.

3. A method of manufacturing a semiconductor device according to claim 1, wherein the laser light is a continuous laser light.

4. A method of manufacturing a semiconductor device according to claim 1, wherein a concentration of the impurity element in the crystalline semiconductor layer is $1\times10^{15}$ to $5\times10^{18}/cm^3$ and in the range of the concentration being $\pm10\%$ for an average.

5. A method of manufacturing a semiconductor device, comprising:
   forming a base insulating film on a substrate,
   forming an amorphous semiconductor layer over the base insulating film;
   crystallizing the amorphous semiconductor layer by irradiating a laser light to obtain a crystalline semiconductor layer;
   introducing an impurity element of one conductivity type into an upper surface portion of the crystalline semiconductor layer;
   irradiating the crystalline semiconductor layer with a second laser light to redistribute the impurity;
   removing the upper surface portion of the crystalline semiconductor layer, after the irradiation step; and
   forming a channel portion of an insulated gate field effect transistor from a remaining portion of the crystalline semiconductor layer,
   wherein the remaining portion comprises the impurity element.

6. A method of manufacturing a semiconductor device according to claim 5, wherein 10 to 40 nm of the thickness of the upper surface portion is removed.

7. A method of manufacturing a semiconductor device according to claim 5, wherein the laser light is a continuous wave laser light.

8. A method of manufacturing a semiconductor device according to claim 5, wherein a concentration of the impurity element in the crystalline semiconductor layer is $1\times10^{15}$ to $5\times10^{18}/cm^3$ and in the range of the concentration being $\pm10\%$ for an average.

9. A method of manufacturing a semiconductor device, comprising:
   forming an amorphous semiconductor layer over a substrate;
   crystallizing the amorphous semiconductor layer by irradiating a first laser light to obtain a crystalline semiconductor layer;
   introducing an impurity element of one conductivity type into an upper surface portion of the crystalline semiconductor layer;
   irradiating the crystalline semiconductor layer with a second laser light to redistribute the impurity;
   removing the upper surface portion of the crystalline semiconductor layer, after the irradiation step; and
   forming a channel portion of an insulated gate field effect transistor from a remaining portion of the crystalline semiconductor layer,
   wherein the remaining portion comprises the impurity element.

10. A method of manufacturing a semiconductor device according to claim 9, wherein 10 to 40 nm of the thickness of the upper surface portion is removed.

11. A method of manufacturing a semiconductor device according to claim 9, wherein the first laser light is a pulse laser light.

12. A method of manufacturing a semiconductor device according to claim 9, wherein the second laser light is a continuous wave laser light.

13. A method of manufacturing a semiconductor device according to claim 9, wherein a concentration of the impurity element in the crystalline semiconductor layer is $1\times10^{15}$ to $5\times10^{18}/cm^3$ and in the range of the concentration being $\pm10\%$ for an average.

14. A method of manufacturing a semiconductor device, comprising:
   forming a base insulating film on a substrate,
   forming an amorphous semiconductor layer over the base insulating film;

crystallizing the amorphous semiconductor layer by irradiating a first laser light to obtain a crystalline semiconductor layer;

introducing an impurity element of one conductivity type into an upper surface portion of the crystalline semiconductor layer;

irradiating the crystalline semiconductor layer with second laser light to redistribute the impurity;

removing the upper surface portion of the crystalline semiconductor layer, after the irradiation step; and forming a channel portion of an insulated gate field effect transistor from a remaining portion of the crystalline semiconductor layer, wherein the remaining portion comprises the impurity element.

15. A method of manufacturing a semiconductor device according to claim 14, wherein 10 to 40 nm of the thickness of the upper surface portion is removed.

16. A method of manufacturing a semiconductor device according to claim 14, wherein the first laser light is a pulse laser light.

17. A method of manufacturing a semiconductor device according to claim 14, wherein the second laser light is a continuous wave laser light.

18. A method of manufacturing a semiconductor device according to claim 14, wherein a concentration of the impurity element in the crystalline semiconductor layer is $1 \times 10^{15}$ to $5 \times 10^{18}/cm^3$ and in the range of the concentration being ±10% for an average.

* * * * *